US012813328B2

(12) United States Patent
Lee et al.

(10) Patent No.: US 12,813,328 B2
(45) Date of Patent: Nov. 24, 2026

(54) MOLDING COMPOSITION, SEMICONDUCTOR PACKAGE AND METHOD OF FABRICATING THE SAME

(71) Applicant: Taiwan Semiconductor Manufacturing Company, Ltd., Hsinchu (TW)

(72) Inventors: Chia Hao Lee, Hsinchu County (TW); Meng-Hsuan Hsiao, Hsinchu City (TW); Sih-Hao Liao, New Taipei City (TW); Ming-Shih Yeh, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 675 days.

(21) Appl. No.: 18/325,117

(22) Filed: May 30, 2023

(65) Prior Publication Data

US 2024/0404898 A1 Dec. 5, 2024

(51) Int. Cl.
*H10W 74/47* (2026.01)
*C08L 63/00* (2006.01)
(Continued)

(52) U.S. Cl.
CPC ........... *H10W 74/473* (2026.01); *C08L 63/00* (2013.01); *H10P 72/74* (2026.01); *H10W 70/05* (2026.01); *H10W 70/09* (2026.01); *H10W 70/093* (2026.01); *H10W 70/611* (2026.01); *H10W 70/614* (2026.01); *H10W 70/65* (2026.01); *H10W 70/685* (2026.01); *H10W 74/016* (2026.01); *H10W 74/019* (2026.01); *H10W 74/117* (2026.01); *H10W 90/00* (2026.01); *H10P 72/7436* (2026.01); *H10W 70/60* (2026.01); *H10W 70/6528* (2026.01); *H10W 90/28* (2026.01); *H10W 90/291* (2026.01); *H10W 90/722* (2026.01); *H10W 90/754* (2026.01)

(58) Field of Classification Search
CPC ....................... C08L 63/00; H10W 74/00–481
See application file for complete search history.

(56) References Cited

U.S. PATENT DOCUMENTS

| | | | |
|---|---|---|---|
| 9,000,584 | B2 | 4/2015 | Lin et al. |
| 9,048,222 | B2 | 6/2015 | Hung et al. |

(Continued)

OTHER PUBLICATIONS

Barry Arkles, and Jonathan Goff. "Silanes and Silicones for Epoxy Resins" (Year: 2017).*

*Primary Examiner* — Daniel P Shook
(74) *Attorney, Agent, or Firm* — JCIPRNET

(57) ABSTRACT

A molding composition for a semiconductor package includes fillers, a resin, a hardener and a stress relaxation agent. The fillers are contained in an amount of 80% by weight to 90% by weight based on a total weight of the molding composition. The resin is contained in an amount of 1% by weight to 15% by weight based on a total weight of the molding composition. The hardener is contained in an amount of 1% by weight to 15% by weight based on a total weight of the molding composition. The stress relaxation agent is composed of silicone oil, and is contained in an amount of 0.5% by weight to 5% by weight based on a total weight of the molding composition.

20 Claims, 10 Drawing Sheets

(51) Int. Cl.

| | |
|---|---|
| ***H10P 72/70*** | (2026.01) |
| ***H10W 70/05*** | (2026.01) |
| ***H10W 70/09*** | (2026.01) |
| ***H10W 70/60*** | (2026.01) |
| ***H10W 70/65*** | (2026.01) |
| ***H10W 70/652*** | (2026.01) |
| ***H10W 70/685*** | (2026.01) |
| ***H10W 74/01*** | (2026.01) |
| ***H10W 74/10*** | (2026.01) |
| ***H10W 90/00*** | (2026.01) |
| ***H10W 90/20*** | (2026.01) |
| ***H10W 90/28*** | (2026.01) |

(56) References Cited

U.S. PATENT DOCUMENTS

| | | | | |
|---|---|---|---|---|
| 9,048,233 | B2 | 6/2015 | Wu et al. | |
| 9,064,879 | B2 | 6/2015 | Hung et al. | |
| 9,111,949 | B2 | 8/2015 | Yu et al. | |
| 9,263,511 | B2 | 2/2016 | Yu et al. | |
| 9,281,254 | B2 | 3/2016 | Yu et al. | |
| 9,368,460 | B2 | 6/2016 | Yu et al. | |
| 9,372,206 | B2 | 6/2016 | Wu et al. | |
| 9,496,189 | B2 | 11/2016 | Yu et al. | |
| 2008/0131702 | A1* | 6/2008 | Bae | C08G 59/245 257/E21.001 |
| 2020/0058626 | A1* | 2/2020 | Tai | H10P 72/74 |

* cited by examiner

MOLDING COMPOSITION, SEMICONDUCTOR PACKAGE AND METHOD OF FABRICATING THE SAME

BACKGROUND

Semiconductor devices and integrated circuits used in a variety of electronic applications, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
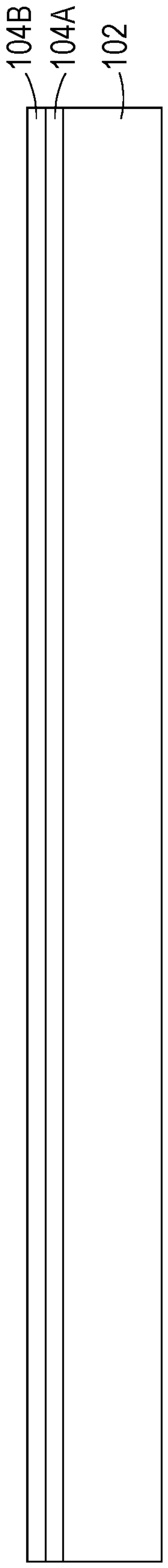
FIG. 1A to FIG. 1G are schematic sectional views of various stages in a method of fabricating a first package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath”, “below”, “lower”, “on”, “over”, “overlying”, “above”, “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1G are schematic sectional views of various stages in a method of fabricating a first package according to some exemplary embodiments of the present disclosure. Referring to FIG. 1A, a carrier 102 with a buffer layer (including 104A, 104B) coated thereon is provided. In one embodiment, the carrier 102 may be a glass carrier or any suitable carrier for carrying a semiconductor wafer or a reconstituted wafer for the manufacturing method of the package structure.

In some embodiments, the buffer layer includes a de-bonding layer 104A and a dielectric layer 104B, wherein the de-bonding layer 104A is located in between the carrier 102 and the dielectric layer 104B. In certain embodiments, the de-bonding layer 104A is disposed on the carrier 102, and the material of the de-bonding layer 104A may be any material suitable for bonding and de-bonding the carrier 102 from the above layer(s) (e.g., the dielectric layer 104B) or any wafer(s) disposed thereon. In some embodiments, the de-bonding layer 104A may include a release layer (such as a light-to-heat conversion (“LTHC”) layer) or an adhesive layer (such as an ultra-violet curable adhesive or a heat curable adhesive layer). In some embodiments, the dielectric layer 104B may be formed above the de-bonding layer 104A. The dielectric layer 104B may be made of dielectric materials such as benzocyclobutene (“BCB”), polybenzoxazole (“PBO”), or any other suitable polymer-based dielectric material. Furthermore, the top surface of the dielectric layer 104B may have a high degree of coplanarity.

It is noted that the materials of the carrier 102, the de-bonding layer 104A and the dielectric layer 104B are not limited to the descriptions of the embodiments. In some alternative embodiments, the dielectric layer 104B may be optionally omitted; in other words, merely the de-bonding layer 104A is formed over the carrier 102. In certain embodiments, a die-attach film may be directly formed on the de-bonding layer 104A for the attachment to above components.

Figure 1B:
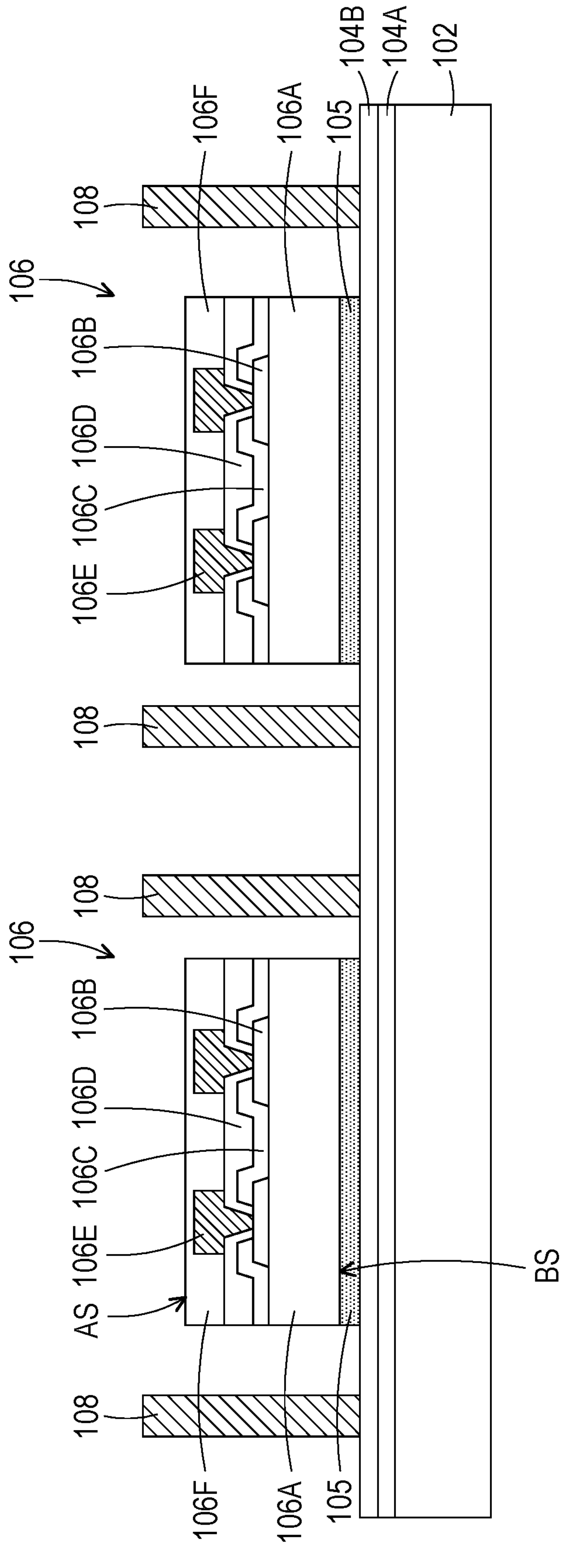

Referring to FIG. 1B, after providing the carrier 102 and the buffer layer (including 104A, 104B), a plurality through insulator vias 108 is formed on the buffer layer and over the carrier 102, and a plurality of semiconductor dies 106 is provided on the buffer layer 103. Referring to FIG. 1B, in some embodiments, the through insulator vias 108 are through integrated fan-out (“InFO”) vias. In some embodiments, the formation of the through insulator vias 108 includes forming a mask pattern (not shown) with openings, then forming a metallic material (not shown) filling up the openings by electroplating or deposition, and removing the mask pattern to form the through insulator vias 108 on the carrier 102. The material of the mask pattern may include a positive photo-resist or a negative photo-resist. In one embodiment, the material of the through insulator vias 108 may include a metal material such as copper or copper alloys, or the like. However, the disclosure is not limited thereto.

In an alternative embodiment, the through insulator vias 108 may be formed by forming a seed layer (not shown) on the dielectric layer 104B; forming the mask pattern with openings exposing portions of the seed layer; forming the metallic material on the exposed portions of the seed layer to form the through insulator vias 108 by plating; removing the mask pattern; and then removing portions of the seed layer exposed by the through insulator vias 108. For example, the seed layer may be a titanium/copper composited layer. For simplification, only four through insulator vias 108 are illustrated in FIG. 1B. However, it should be noted that the number of through insulator vias 108 is not limited thereto, and can be selected based on requirement.

In some embodiments, one or more semiconductor dies 106 may be picked and placed on the dielectric layer 104B. For example, each of the semiconductor dies 106 have an active surface AS, and a backside surface BS opposite to the active surface AS. In some embodiments, a die attach film 105 is attached on the backside surface BS of the semiconductor dies 106 for bonding the semiconductor dies 106 to a top surface of the dielectric layer 104B. By using the die attach film 105, a better adhesion between the semiconductor dies 106 and the dielectric layer 104B is ensured. In the exemplary embodiment, two semiconductor dies 106 are illustrated on the buffer layer (including 104A, 104B). However, the disclosure is not limited thereto. In other embodiments, the number of semiconductor dies 106 disposed on the carrier 102 may be adjusted based on product requirement.

In the exemplary embodiment, the semiconductor dies 106 include a semiconductor substrate 106A, a plurality of conductive pads 106B, a passivation layer 106C, a post passivation layer 106D, a plurality of conductive posts or conductive vias 106E, and a protection layer 106F. As illustrated in FIG. 1B, the plurality of conductive pads 106B is disposed on the semiconductor substrate 106A. The passivation layer 106C is formed over the semiconductor substrate 106A and has openings that partially expose the conductive pads 106B on the semiconductor substrate 106A.

In some embodiments, the semiconductor substrate 106A is a bulk silicon substrate or a silicon-on-insulator (SOI) substrate, and further includes several microelectronic layers formed therein. For example, these layers may include conductor layers, semiconductor layers, dielectric layers, active devices (e.g., transistors or the like) and passive devices (e.g., resistors, capacitors, inductors or the like), or the like (all not shown). The dielectric layer may be silicon oxide, silicon nitride, silicon oxynitride, low-k dielectric materials, high-k dielectric materials, or combinations thereof. In one embodiment, the dielectric layers include extreme low dielectric constant (ELK) films. As used herein, low dielectric constant materials are those films having a dielectric constant between 3.0 to 2.5 and extreme low dielectric constant films are those having a dielectric constant below 2.5 extending to dielectric constants below 2.0. The ELK films may include any ELK films including but not limited to inorganic, organic, and hybrid dielectric materials.

In some embodiments, the conductive pads 106B may be aluminum pads, copper pads or other suitable metal pads. The passivation layer 106C may be a silicon oxide layer, a silicon nitride layer, a silicon oxy-nitride layer or a dielectric layer formed of any suitable dielectric materials. Furthermore, in some embodiments, the post-passivation layer 106D is optionally formed over the passivation layer 106C. The post-passivation layer 106D covers the passivation layer 106C and has a plurality of contact openings. The conductive pads 106B are partially exposed by the contact openings of the post passivation layer 106D. The post-passivation layer 106D may be a benzocyclobutene (BCB) layer, a polyimide layer, a polybenzoxazole (PBO) layer, or a dielectric layer formed by other suitable polymers. In some embodiments, the conductive posts or conductive vias 106E are formed on the conductive pads 106B by plating. In some embodiments, the protection layer 106F is formed on the post passivation layer 106F covering the conductive posts or conductive vias 106E so as to protect the conductive posts or conductive vias 106E.

In some embodiments, when more than one semiconductor dies 106 are placed on the dielectric layer 104B, the semiconductor dies 106 may be arranged in an array, and when the semiconductor dies 106 are arranged in an array, the through insulator vias 108 may be classified into groups. The number of the semiconductor dies 106 may correspond to the number of the groups of the through insulator vias 108. In the illustrated embodiment, the semiconductor dies 106 may be picked and placed on the dielectric layer 104B after the formation of the through insulator vias 108. However, the disclosure is not limited thereto. In some alternative embodiments, the semiconductor dies 106 may be picked and placed on the dielectric layer 104B before the formation of the through insulator vias 108.

In some embodiments, the semiconductor dies 106 may be selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. The disclosure is not limited thereto.

Figure 1C:
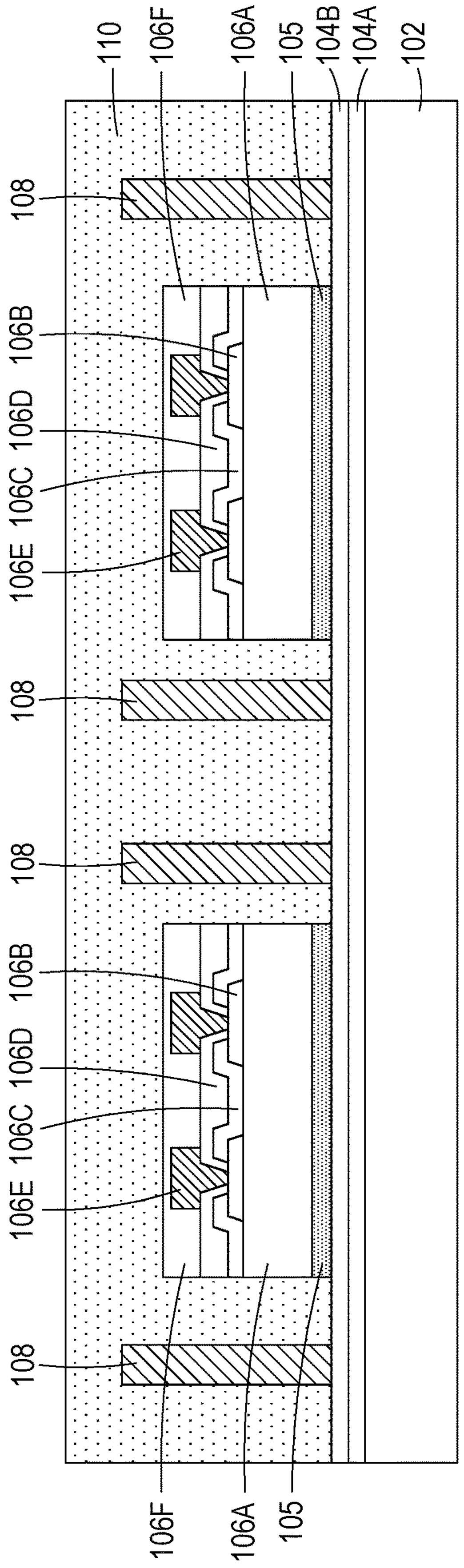

Referring to FIG. 1C, an insulating material 110 is formed on the dielectric layer 104B and over the semiconductor dies 106. In some embodiments, the insulating material 110 is formed through, for example, a compression molding process, filling up the gaps between the semiconductor dies 106 and the through insulating vias 108 to encapsulate the semiconductor dies 106. The insulating material 110 also fills up the gaps between adjacent through insulator vias 108 to encapsulate the through insulator vias 108. The conductive posts or conductive vias 106E and the protection layer 106F of the semiconductor dies 106 are encapsulated by and well protected by the insulating material 110. In other words, the conductive posts or conductive vias 106E and the protection layer 106F of the semiconductor dies 106 are not revealed and are well protected by the insulating material 110.

In some embodiments, the insulating material 110 is made by a molding composition that comprises (a) fillers, (b) resin, (c) hardener and (d) stress relation agents. In some embodiments, the fillers include inorganic fillers such as silicon oxide ($SiO_2$), or the like, that are added into the molding composition to optimize coefficient of thermal expansion (CTE) of the insulating material 110. In some embodiments, the resin includes resins such as epoxy resins, phenolic resins, silicon-containing resins, or other suitable resins. In certain embodiments, the epoxy resins include diepoxy resin or multifunctional epoxy resin. In some embodiments, the diepoxy resin includes but are not limited to: (i) 1,6-bis(2,3-epoxypropoxy)naphthalene, (ii) 2,6-bis(2,3-epoxypropoxy)acetophenone, (iii) 2,2-Bis(4-glycidyloxyphenyl)propane, (iv) 3,4-Epoxycyclohexylmethyl 3,4-epoxycyclohexanecarboxylate. In some embodiments, the multifunctional epoxy resin includes but are not limited to: (i) 1-(2,3-epoxypropoxy)-2,2-bis[(2,3-epoxypropoxy) methyl]butane, (ii) triphenylolmethane triglycidyl ether, (iii) 1,1,1-tris(4-hydroxyphenyl)ethane hydroxyphenyl)ethane triglycidyl ether, (iv) tris(oxiranylmethyl) benzene-1,3,5-tricarboxylate. In some embodiments, the hardener may be an anhydride-based hardener or an amine-based hardener. In some embodiments, the anhydride-based hardener includes but are not limited to: (i) methylhexahydrophthalic anhydride, (ii) 3-methylhexahydrophthalic anhydride, (iii) 5-methylhexahydrophthalic anhydride, (iv) phenylmaleic anhydride. In certain embodiments, the amine-based hardener includes but are not limited to: (i) 1,2-diaminocyclohexane, (ii) 4,4'-diaminodiphenylsulfone, (iii) 2,2'-oxybis (methylene)dianiline, (iv) diethylenetriamine.

Furthermore, in some embodiments the stress relaxation agent is composed of silicone oil, and include at least one compound selected from the group of compounds represented by formula (1):

formula (1)

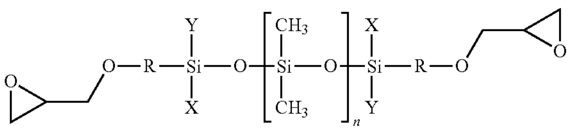

wherein, in formula (1), X is independently $CH_3$, $C_2H_5$, $C_3H_7$, $C_6H_5$, $C_{10}H_7$, $C_{12}H_9$, Y is independently $CH_3$, $C_2H_5$, $C_3H_7$, $C_6H_5$, $C_{10}H_7$, $C_{12}H_9$, R is independently $CH_2$, $C_2H_4$, $C_3H_6$, $OCH_2$, $OC_2H_4$, $OC_3H_6$, $OC_2H_2$, $C_2H_2O$, $C_3H_4O$, $C_4H_6O$, and n is 1-100.

In some embodiments, the stress relaxation agent includes a compound represent by formula (1-A):

formula (1-A)

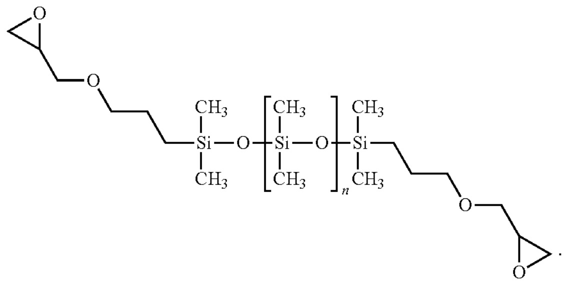

n = 10

For example, in one embodiment, the molding composition includes the compound represent by formula (1-A) as the main component, while other compounds selected from the group of compounds represented by formula (1) may be optionally contained. In certain embodiments, compounds that cannot read into formula (1) are excluded as the stress relaxation agent.

In the exemplary embodiment, based on a total weight of the molding composition, the fillers are contained in an amount of 80% by weight to 90% by weight, the resin is contained in an amount of 1% by weight to 15% by weight, the hardener is contained in an amount of 1% by weight to 15% by weight, and the stress relaxation agent composed of silicone oil is contained in an amount of 0.5% by weight to 5% by weight. In some embodiments, if an amount of the stress relaxation agent in the molding composition is less than 0.5%, then a swelling value of the molding composition (or the formed insulating material 110) will be too high. In certain embodiments, if an amount of the stress relaxation agent in the molding composition is more than 5%, then the physical properties of the insulating material 110 such as the coefficient of thermal expansion, young's modulus, glass transition temperature, and warpage may be affected. In some embodiments, the swelling value of the molding composition is controlled in a range of 0.1% to 0.4%. In certain embodiments, the swelling value of the molding composition is controlled in a range of 0.17% to 0.35%. A thermal mechanical analyzer (TMA) may be used for measuring and calculating the swelling value, whereby the measured sample was ramped to 130° C. (10° C./minute) and held isothermal for 5 minutes at 130° C. during measurement.

In the exemplary embodiment, when the type of stress relaxation agent and the amount of stress relaxation agent used in the molding composition are as designated above, then a swelling strain of the formed insulating material 110 may be reduced. As such, even under high thermal and humidity conditions, the molding composition may reduce hydrogen bonding formation and block water cluster, and the insulating material 110 (or mold) having low swelling can be achieved. Therefore, the prevention of water/moisture absorption to the ELK films in the semiconductor die 106 may be achieved, and an ELK film delamination issue commonly observed in integrated fan-out packages may be resolved. On the other hand, if the stress relaxation agent is not used in the molding composition, an ELK film delamination issue may occur, which may further induce DRAM (dynamic random-access memory) retention failure.

Figure 1D:
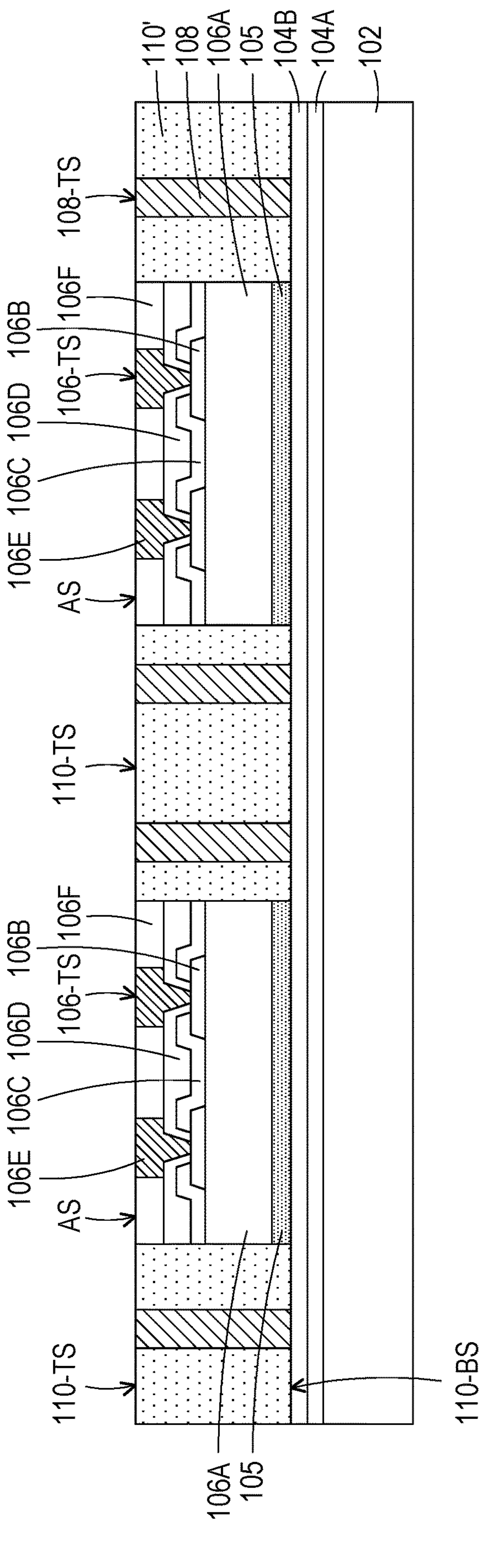

Referring to FIG. 1D, after forming the insulating material 110 (or mold), the insulating material 110 is partially removed to expose the conductive posts 106E and the through insulator vias 108. In some embodiments, the insulating material 110 and the protection layer 106F are ground or polished by a planarization step. For example, the planarization step is performed through a mechanical grinding process and/or a chemical mechanical polishing (CMP) process until the top surfaces 106-TS of the conductive posts 106E (or active surface AS of the semiconductor die 106) are revealed. In some embodiments, the through insulator vias 108 may be partially polished so that the top surfaces 108-TS of the through insulator vias 108 are levelled with the top surfaces 108-TS of the conductive posts 106E, or levelled with the active surface AS of the semiconductor dies 106. In other words, the conductive posts 106E and the through insulator vias 108 may also be slightly grinded/polished.

In the illustrated embodiment, the insulating material 110 is polished to form an insulating encapsulant 110'. In some embodiments, the top surface 110-TS of the insulating encapsulant 110', the top surface 108-TS of the through insulator vias 108, the top surface 106-TS of the conductive posts 106E, and the top surface of the polished protection layer 106F are coplanar and levelled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Figure 1E:
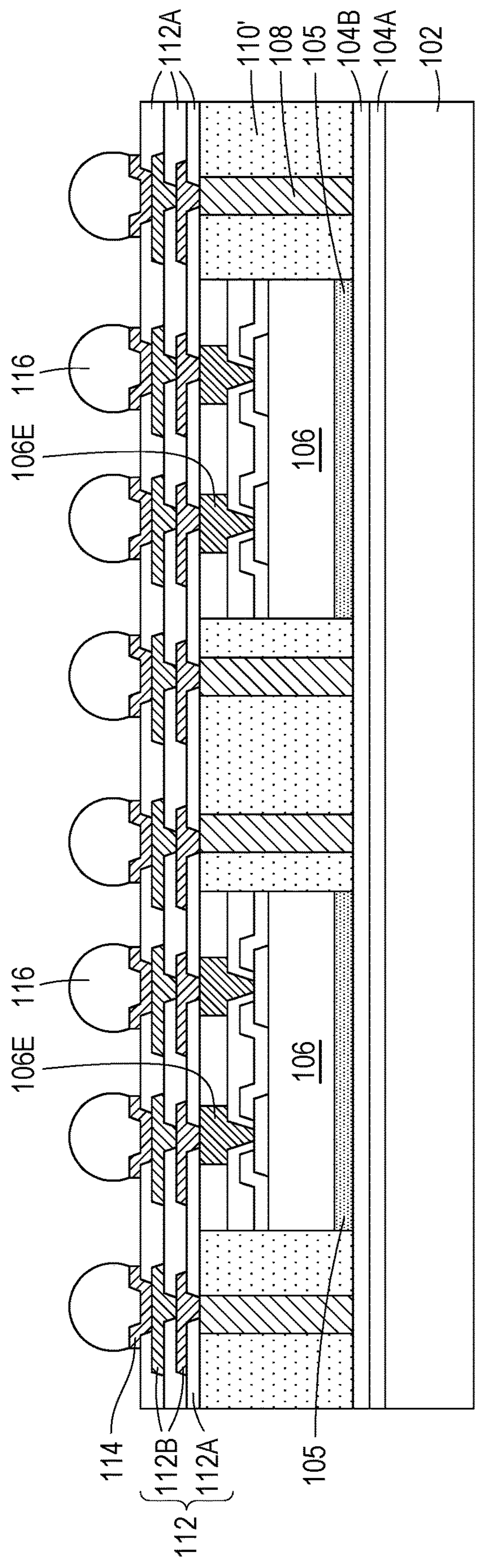

Referring to FIG. 1E, after the planarization step, a redistribution layer 112 is formed on the insulating encapsulant 110', the through insulator vias 108 and the semiconductor dies 106. As illustrated in FIG. 1E, the redistribution layer 112 is formed on the top surface 108-TS of the through insulator vias 108, on the top surfaces 106-TS of the conductive posts 106E, and on the top surface 110-TS of the insulating encapsulant 110'. In some embodiments, the redistribution layer 112 is electrically connected to the through insulator vias 108, and is electrically connected to the semiconductor dies 106 through the conductive posts 106E. In some embodiments, the semiconductor dies 106 are electrically connected to the through insulator vias 108 through the redistribution layer 112.

In some embodiments, the formation of the redistribution layer 112 includes sequentially forming one or more dielectric layers 112A, and one or more metallization layers 112B in alternation. In certain embodiments, the metallization layers 112B are sandwiched between the dielectric layers 112A. Although only two layers of the metallization layers 112B and three layers of dielectric layers 112A are illustrated herein, however, the scope of the disclose is not limited by the embodiments of the disclosure. In other embodiments, the number of metallization layers 112B and the dielectric layers 112A may be adjusted based on product requirement. In some embodiments, the metallization layers 112B are electrically connected to the conductive posts 106E of the semiconductor dies 106. Furthermore, the metallization layers 112B are electrically connected to the through insulator vias 108.

In some embodiments, the material of the dielectric layers 112A may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layers 112A are formed by suitable fabrication techniques such as spin-on coating, chemical vapor deposition (CVD), plasma-enhanced chemical vapor deposition (PECVD) or the like. The disclosure is not limited thereto.

In some embodiments, the material of the metallization layer 112B may be made of conductive materials formed by electroplating or deposition, such as aluminum, titanium, copper, nickel, tungsten, and/or alloys thereof, which may be patterned using a photolithography and etching process. In some embodiments, the metallization layer 112B may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

After forming the redistribution layer 112, a plurality of conductive pads 114 may be disposed on an exposed top surface of the topmost layer of the metallization layers 112B for electrically connecting with conductive balls. In certain embodiments, the conductive pads 114 are for example, under-ball metallurgy (UBM) patterns used for ball mount. As shown in FIG. 1G, the conductive pads 114 are formed on and electrically connected to the second redistribution layer 112. In some embodiments, the materials of the conductive pads 114 may include copper, nickel, titanium, tungsten, or alloys thereof or the like, and may be formed by an electroplating process, for example. The number of conductive pads 114 are not limited in this disclosure, and may be selected based on the design layout. In some alternative embodiments, the conductive pads 114 may be omitted. In other words, conductive balls 120 formed in subsequent steps may be directly disposed on the second redistribution layer 118.

Referring still to FIG. 1E, after forming the conductive pads 114, a plurality of conductive terminals 116 is disposed on the conductive pads 114 and over the redistribution layer 112. In some embodiments, the conductive terminals 116 may be disposed on the conductive pads 114 by a ball placement process or reflow process. In some embodiments, the conductive terminals 116 are, for example, solder balls or ball grid array (BGA) balls. In some embodiments, the conductive terminals 116 are connected to the redistribution layer 112 through the conductive pads 114. In certain embodiments, some of the conductive terminals 116 may be electrically connected to the semiconductor dies 106 through the redistribution layer 112. Furthermore, some of the conductive terminals 116 may be electrically connected to the through insulator vias 108 through the redistribution layer 112. The number of the conductive terminals 116 is not limited to the disclosure, and may be designated and selected based on the number of the conductive pads 114. In some alternative embodiments, an integrated passive device (IPD) (not shown) may optionally be disposed on the redistribution layer 112 and electrically connected to the redistribution layer 112.

Figure 1F:
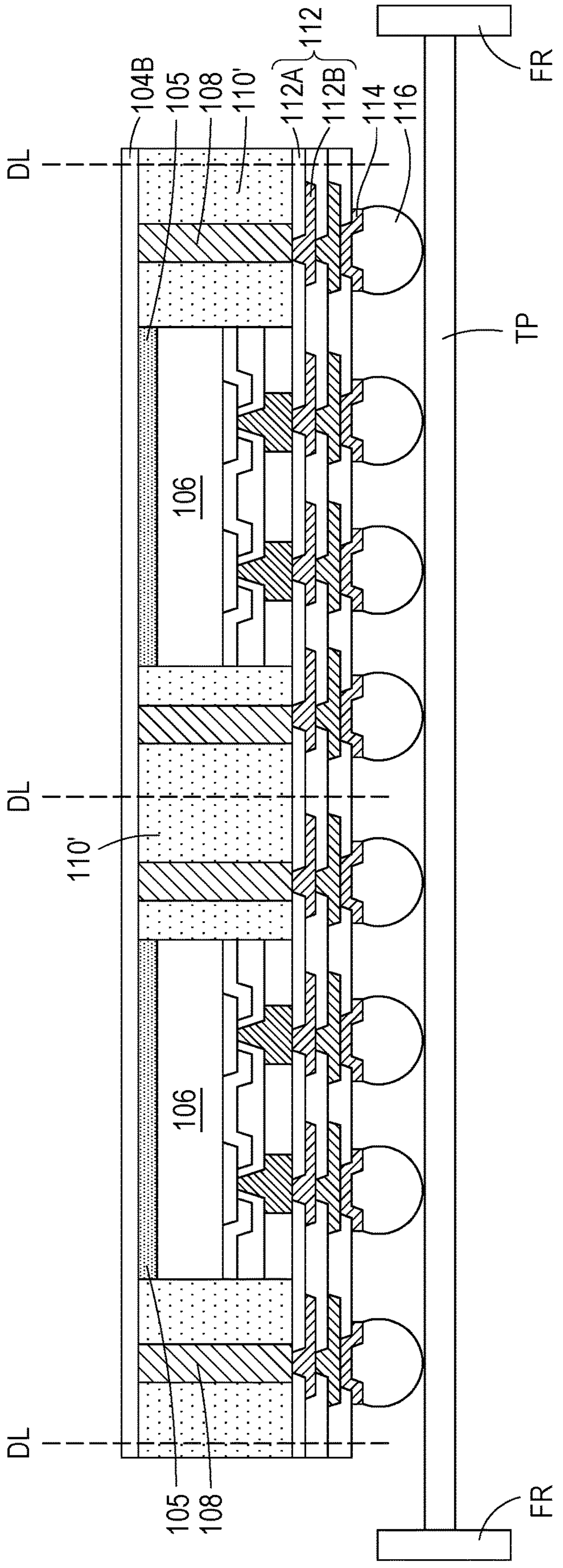
Figure 1G:
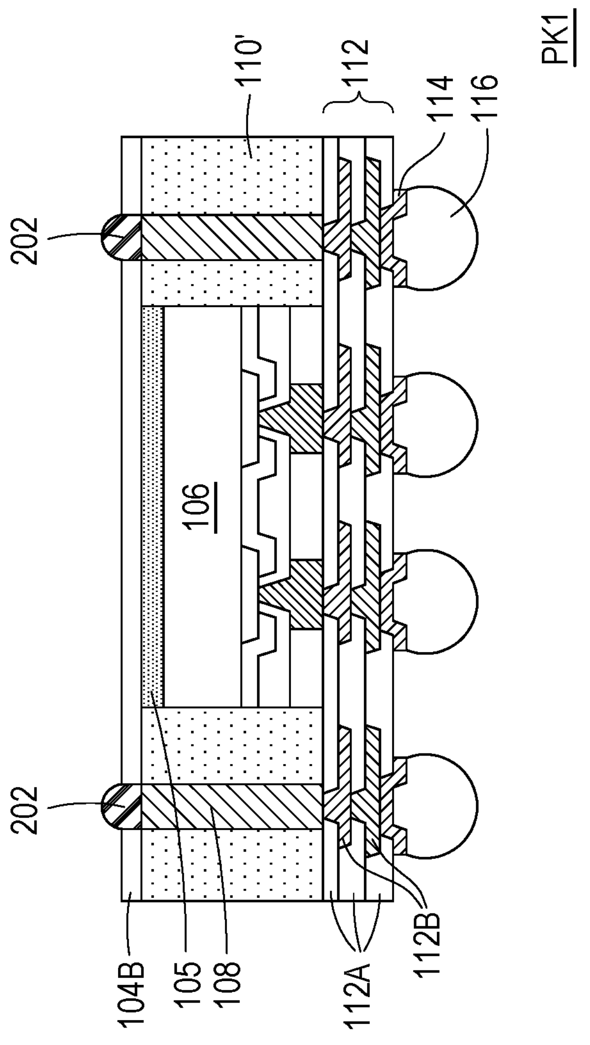

Referring to FIG. 1F, in a subsequent step, after forming the redistribution layer 112 and placing the conductive terminals 116 thereon, the structure shown in FIG. 1E may be turned upside down and attached to a tape TP supported by a frame FR. Subsequently, the carrier 102 may be de-bonded so as to separate the dielectric layer 104B, the semiconductor dies 106 and the other elements formed thereon from the carrier 102. In the exemplary embodiment, the de-bonding process includes projecting a light such as a laser light or an UV light on the de-bonding layer 104A (e.g., the LTHC release layer), such that the carrier 102 can be easily removed. In certain embodiments, the de-bonding layer 104A may be further removed or peeled off to reveal a surface of the dielectric layer 104B.

After debonding the carrier 102, a dicing process is performed along the dicing lines DL to separate individual packages. For example, the dicing is performed to cut through the dielectric layer 104B, the insulating encapsulant 110' and the redistribution layer 112 to form the separated package PK1 (first package) as shown in FIG. 1G. After the dicing process, the dielectric layer 104B may be etched to form openings revealing the through insulator vias 108. Thereafter, a plurality of electrical connectors 202 may be formed in the openings over the through insulator vias 108. For example, the electrical connectors 202 are, for example, reflowed to bond with the bottom surfaces of the through insulator vias 108. Up to here, a first package PK1 having dual-side terminals may be accomplished.

Figure 2A:
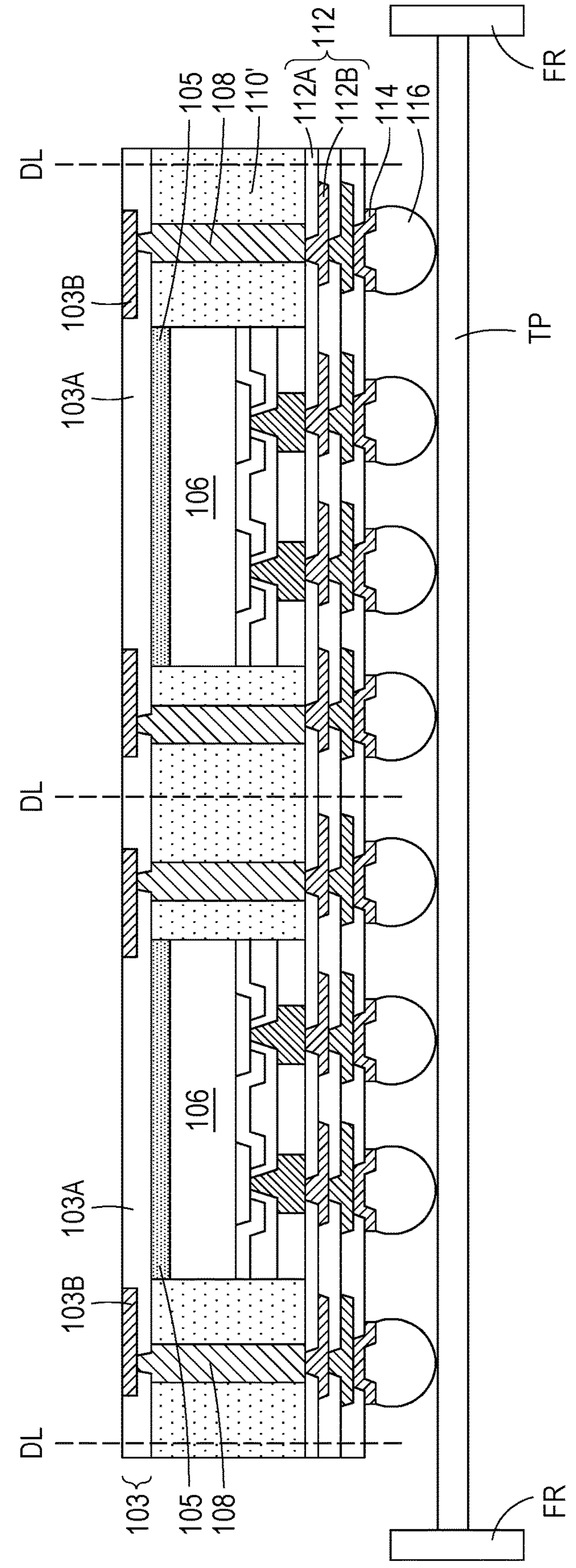
FIG. 2A to FIG. 2B are schematic sectional views of various stages in a method of fabricating a first package according to some other exemplary embodiments of the present disclosure.
Figure 2B:
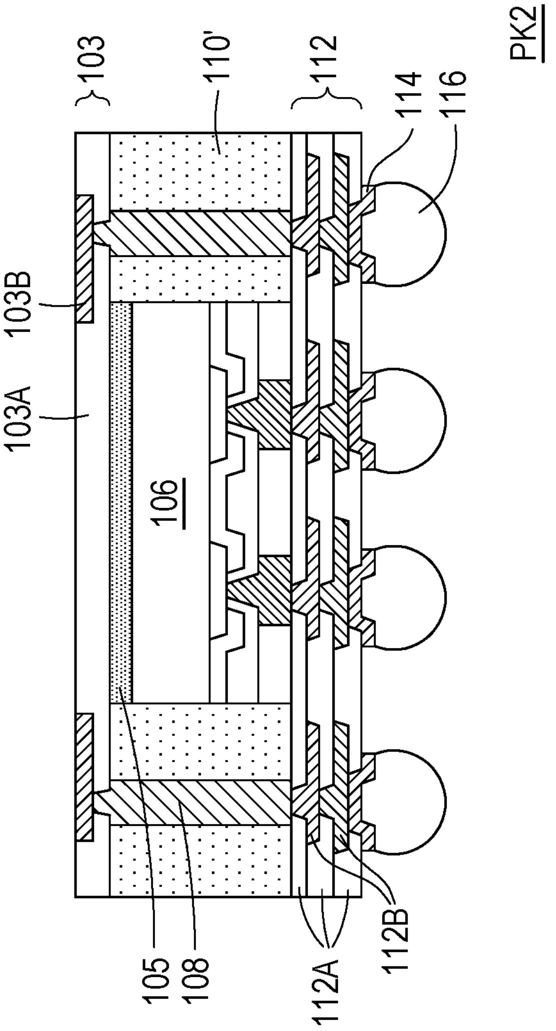

FIG. 2A to FIG. 2B are schematic sectional views of various stages in a method of fabricating a first package according to some other exemplary embodiments of the present disclosure. The method illustrated in FIG. 2A to FIG. 2B is similar to the method illustrated in FIG. 1A to FIG. 1G. Therefore, the same reference numerals are used to refer to the same or like parts, and its detailed description will be omitted herein. The difference between the embodiments is that a backside redistribution layer 103 is formed in FIG. 2A in replacement of the dielectric layer 104B. For example, in the exemplary embodiment, the backside redistribution layer 103 may be formed directly on the de-bonding layer 104A shown in FIG. 1A in replacement of the dielectric layer 104B, while the through insulator vias 108 may be formed to be disposed on and electrically connected to the backside redistribution layer 103. In some embodiments, the backside redistribution layer 103 is formed with one or more dielectric layers 103A, and one or more metallization layers 103B. The materials and method of forming the dielectric layers 103A and the metallization layers 103B may be similar to the materials and method of forming the dielectric layers 112A and metallization layers 112B in the redistribution layer 112, thus its details will be omitted herein.

After forming the backside redistribution layer 103 on the de-bonding layer 104A, the same steps illustrated in FIG. 1B to FIG. 1E may be performed for placing a plurality of semiconductor dies 106 on the backside redistribution layer 103, forming through insulator vias 108 over the backside redistribution layer 103, forming an insulating encapsulant 110' to encapsulate the through insulator vias 108 and the semiconductor dies 106, and forming the redistribution layer 112 and the conductive terminals 116 for providing electrical connection. As illustrated in FIG. 2A after forming the redistribution layer 112 and the conductive terminals 116, the obtained structure may be turned upside down and attached to a tape TP supported by a frame FR. Subsequently, the carrier 102 may be de-bonded by projecting a light such as a laser light or an UV light on the de-bonding layer 104A, such that the carrier 102 along with the de-bonding layer 104A may be easily removed. After the debonding process, a surface of the backside redistribution layer 103 is revealed. For example, the metallization layers 103B of the backside redistribution layer 103 may be revealed.

Referring to FIG. 2B, in a subsequent step, a dicing process is performed along the dicing lines DL (shown in FIG. 2A) to separate individual packages. For example, the dicing is performed to cut through the backside redistribution layer 103, the insulating encapsulant 110' and the redistribution layer 112 to form the separated package PK2 (first package) as shown in FIG. 2B. Up to here, a first package PK2 having dual-side terminals may be accomplished. In the first package PK2 shown in FIG. 2B, since the insulating encapsulant 110' is formed of the designated molding composition, the molding composition may reduce hydrogen bonding formation and block water cluster, and the insulating encapsulant 110' having low swelling can be achieved. Therefore, the prevention of water/moisture absorption to the ELK films in the semiconductor die 106 may be achieved, and an ELK delamination issue commonly observed in integrated fan-out packages may be resolved.

Figure 3:
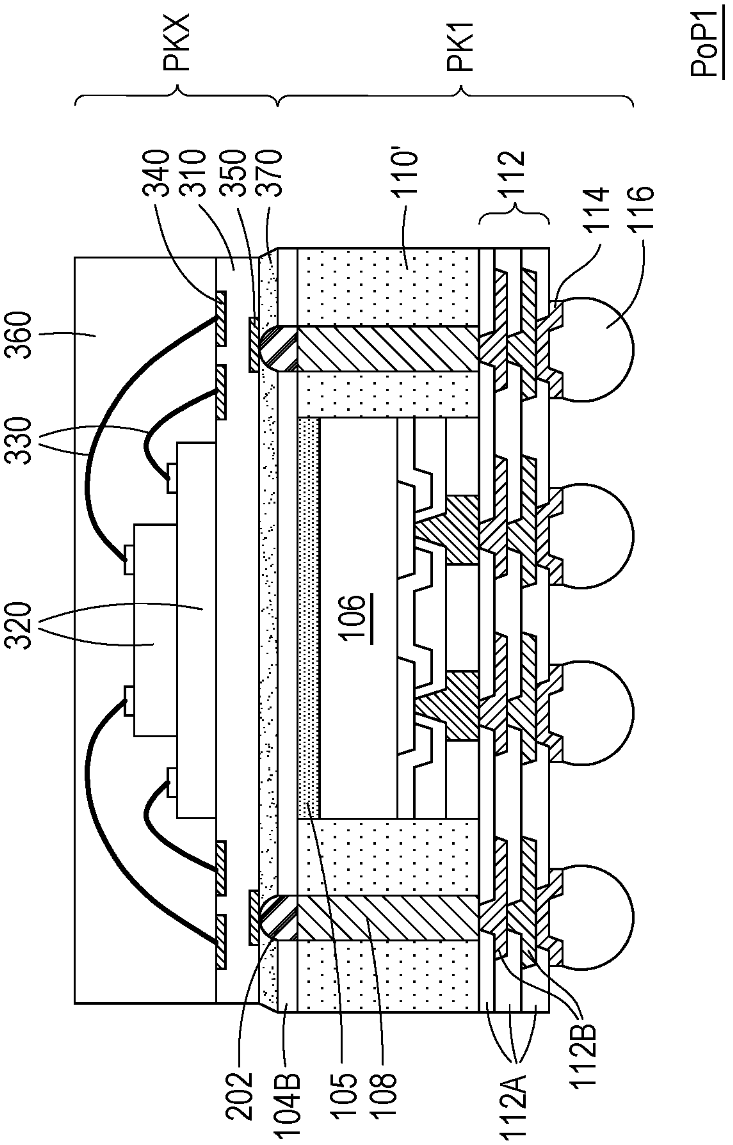
FIG. 3 is a schematic sectional view of a semiconductor package in accordance with some embodiments of the present disclosure.

FIG. 3 is a schematic sectional view of a semiconductor package in accordance with some embodiments of the present disclosure. Referring to FIG. 3, in some embodiments, after forming the first package PK1 illustrated in FIG. 1G, a second package PKX may be provided and stacked on the first package PK1. In the exemplary embodiment, the second package PKX has a substrate 310, a plurality of semiconductor chips 320 mounted on one surface (e.g. top surface) of the substrate 310. In some embodiments, the semiconductor chips 320 are logic chips (e.g., central processing unit, microcontroller, etc.), memory chips (e.g., dynamic random access memory (DRAM) chip, static random access memory (SRAM) chip, etc.), power management chips (e.g., power management integrated circuit (PMIC) chip), radio frequency (RF) chips, sensor chips, signal processing chips (e.g., digital signal processing (DSP) chips), front-end chips (e.g., analog front-end (AFE) chips, the like, or a combination thereof. In one embodiment, both of the semiconductor chips 320 may, for example, be DRAM chips, but the disclosure is not limited thereto.

In some embodiments, bonding wires 330 are used to provide electrical connections between the semiconductor chips 320 and pads 340 (such as bonding pads). In some embodiments, an insulating encapsulant 360 is formed to encapsulate the semiconductor chips 320 and the bonding wires 330 to protect these components. In some embodiments, through insulator vias (not shown) may be used to provide electrical connection between the pads 340 and conductive pads 350 (such as bonding pads) that are located on another surface (e.g. bottom surface) of the substrate 310. In certain embodiments, the conductive pads 350 are electrically connected to the semiconductor chips 320 through these through insulator vias (not shown). In some embodiments, the conductive pads 350 of the second package PKX are electrically connected to the through insulator vias 108 of the first package PK1 through electrical connectors 202. In some embodiments, an underfill 370 is further provided to fill in the spaces between the electrical connectors 202 so as to protect the electrical connectors 202. After stacking the second package PKX on the first package PK1 and providing electrical connection therebetween, a package-on-package structure PoP1 (or semiconductor package) according to some exemplary embodiments can be fabricated.

Figure 4:
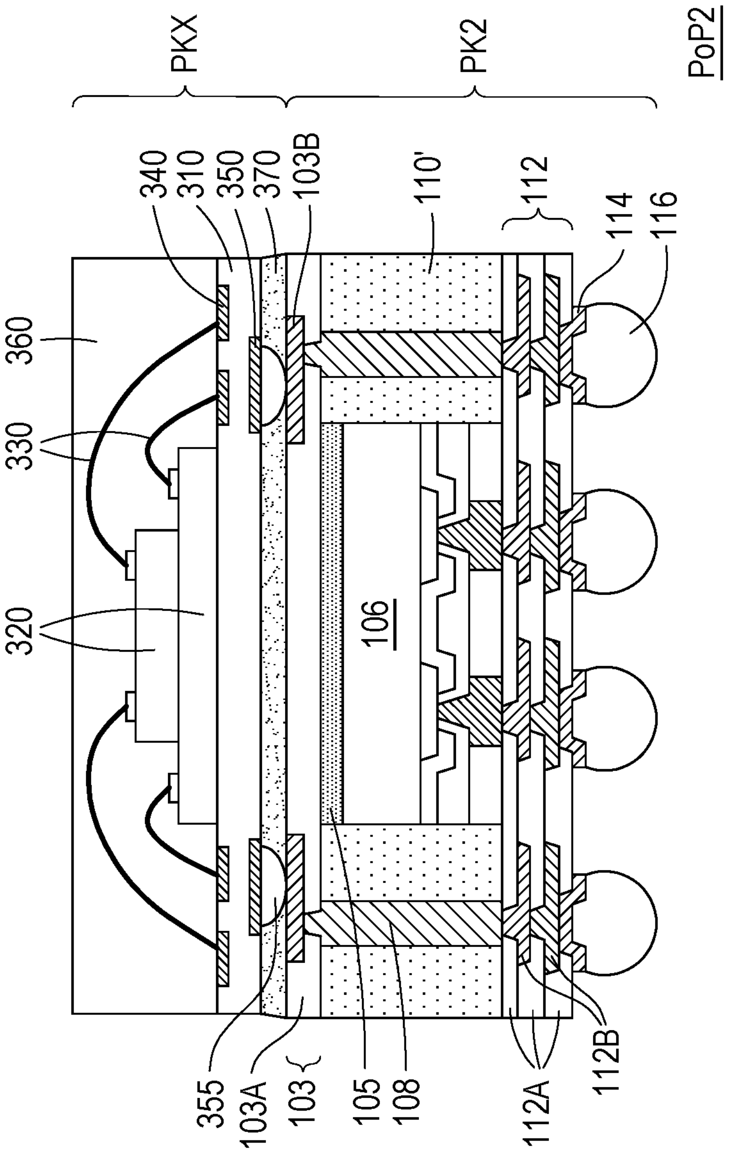
FIG. 4 is a schematic sectional view of a semiconductor package in accordance with some other embodiments of the present disclosure.

FIG. 4 is a schematic sectional view of a semiconductor package in accordance with some other embodiments of the present disclosure. Referring to FIG. 4, in some embodiments, after forming the first package PK2 illustrated in FIG. 2B, a second package PKX may be provided and stacked on the first package PK2. In the exemplary embodiment, the second package PKX illustrated in FIG. 4 is the same as the second package PKX illustrated in FIG. 3, thus its details will not be repeated herein. In some embodiments, a plurality of electrical connectors 355 is further disposed on the conductive pads 350 of the second package PKX for electrically connecting the second package PKX to the first package PK2. In certain embodiments, the electrical connectors 355 are physically joined to the metallization layers 103B of the first package PK2 and physically joined to the conductive pads 350 of the second package PKX. Furthermore, an underfill 370 is further provided to fill in the spaces between the electrical connectors 355 so as to protect the electrical connectors 355. After stacking the second package PKX on the first package PK2 and providing electrical connection therebetween, a package-on-package structure PoP2 (or semiconductor package) according to some exemplary embodiments can be fabricated.

Examples

To prove that the molding composition of the embodiments can be used to lower the swelling strain, the swelling value of different molding compositions including and excluding the stress relaxation agents are compared, and the results are shown in Table 1.

TABLE 1

| | Comparative composition 1 | | Example composition 1 | | Comparative composition 2 | | Example composition 2 | |
|---|---|---|---|---|---|---|---|---|
| | Type | Amount | Type | Amount | Type | Amount | Type | Amount |
| Filler | $SiO_2$ | 87% | $SiO_2$ | 86% | $SiO_2$ | 87% | $SiO_2$ | 86% |
| Resin | diepoxy resin | 9% | diepoxy resin | 9% | multifunctional epoxy resin | 11% | multifunctional epoxy resin | 11% |
| Hardener | anhydride-based hardener | 4% | anhydride-based hardener | 4% | amine-based resin | 2% | amine-based resin | 2% |
| Stress relaxation agent | N/A | — | Silicon oil (formula (1-A)) | 1% | N/A | — | Silicon oil (formula (1-A)) | 1% |
| Swelling Value | 0.9% | | 0.35% | | 0.8% | | 0.17% | |

Referring to Table 1, comparative compositions 1 and 2 are conventional compositions that exclude the use of stress relation agents, while example compositions 1 and 2 are molding compositions of the present disclosure whereby stress relaxation agents are added. As shown in comparative compositions 1 and 2 of Table 1, when stress relation agents are not added in the molding composition, the swelling value of the composition is in a range of 0.8% to 0.9%. In comparison, if 0.5~5% by weight of stress relaxation agent is added into the composition, then as shown in example compositions 1 and 2, the swelling value may be significantly reduced to a range of 0.17% to 0.35%.

Furthermore, it is found that the mold formed by the example compositions 1 and 2 have physical properties (coefficient of thermal expansion, young's modulus, glass transition temperature, and warpage, etc.) that are comparable to the mold formed by comparative compositions 1 and 2. This indicates that the example compositions 1 and 2 can maintain the suitable physical properties of conventional mold, while further reducing the swelling value. An evaluation of the delamination length of the mold under high thermal and humidity conditions after 300 hours using the scanning electron microscope (SEM) also shows that the mold formed by example compositions 1 and 2 have 50% to 60% reduction in delamination length as compared to the mold formed by the comparative compositions 1 and 2. These experimental results prove that the molding compositions of the present disclosure will further reduce the swelling value, and improve ELK delamination resistance.

According to the above embodiments, the molding composition for a semiconductor package includes at least a stress relaxation agent composed of silicone oil, which is contained in an amount of 0.5% by weight to 5% by weight based on a total weight of the molding composition. As such, the molding composition may reduce hydrogen bonding formation and block water cluster, and the insulating encapsulant formed by the molding composition will have low swelling properties. Therefore, the prevention of water/moisture absorption to the ELK films in the semiconductor die may be achieved, and an ELK delamination issue commonly observed in integrated fan-out packages may be resolved.

In accordance with some embodiments of the present disclosure, a molding composition for a semiconductor package includes fillers, a resin, a hardener and a stress relaxation agent. The fillers are contained in an amount of 80% by weight to 90% by weight based on a total weight of the molding composition. The resin is contained in an amount of 1% by weight to 15% by weight based on a total weight of the molding composition. The hardener is contained in an amount of 1% by weight to 15% by weight based on a total weight of the molding composition. The stress relaxation agent is composed of silicone oil, and is contained in an amount of 0.5% by weight to 5% by weight based on a total weight of the molding composition.

In accordance with some other embodiments of the present disclosure, a semiconductor package includes a first package. The first package includes a semiconductor die, an insulating encapsulant, and a redistribution layer. The insulating encapsulant is surrounding the semiconductor die, wherein the insulating encapsulant is formed from a molding composition comprising a stress relaxation agent composed of silicone oil, wherein the stress relation agent is at least one compound selected from the group of compounds represented by formula (1):

formula (1)

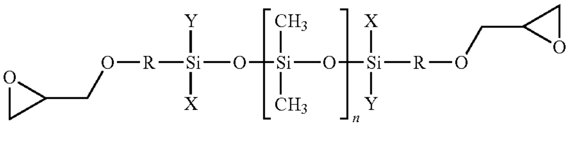

wherein, in formula (1), X is independently $CH_3$, $C_2H_5$, $C_3H_7$, $C_6H_5$, $C_{10}H_7$, $C_{12}H_9$, Y is independently $CH_3$, $C_2H_5$, $C_3H_7$, $C_6H_5$, $C_{10}H_7$, $C_{12}H_9$, R is independently $CH_2$, $C_2H_4$, $C_3H_6$, $OCH_2$, $OCH_4$, $OC_3H_6$, $OC_2H_2$, $C_2H_2O$, $C_3H_4O$, $C_4H_6O$, and n is 1-100. The redistribution layer is disposed on the insulating encapsulant and electrically connected to the semiconductor die.

In accordance with yet another embodiment of the present disclosure, a method of fabricating a semiconductor package includes forming a first package by the following steps. A semiconductor die is placed on a carrier. An insulating encapsulant is formed on the carrier and surrounding the semiconductor die, wherein the insulating encapsulant is formed from a molding composition comprising a stress relaxation agent composed of silicone oil, wherein the stress relation agent is at least one compound selected from the group of compounds represented by formula (1):

formula (1)

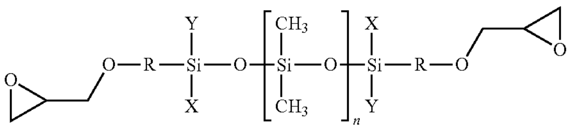

wherein, in formula (1), X is independently $CH_3$, $C_2H_5$, $C_3H_7$, $C_6H_5$, $C_{10}H_7$, $C_{12}H_9$, Y is independently $CH_3$, $C_2H_5$, $C_3H_7$, $C_6H_5$, $C_{10}H_7$, $C_{12}H_9$, R is independently $CH_2$, $C_2H_4$, $C_3H_6$, $OCH_2$, $OCH_4$, $OC_3H_6$, $OC_2H_2$, $C_2H_2O$, $C_3H_4O$, $C_4H_6O$, and n is 1-100. A redistribution layer is formed to be disposed on the insulating encapsulant and electrically connected to the semiconductor die, and the carrier is de-bonded.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:

a first package, comprising:

a semiconductor die;

an insulating encapsulant surrounding the semiconductor die, wherein the insulating encapsulant is formed from a molding composition comprising a stress relaxation agent composed of silicone oil, wherein the stress relaxation agent consists of compounds represented by formula (1):

formula (1)

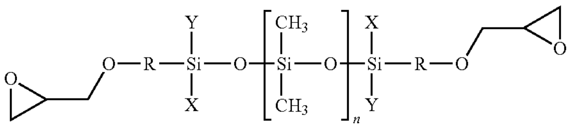

wherein, in formula (1), X is independently $CH_3$, $C_2H_5$, $C_3H_7$, $C_6H_5$, $C_{10}H_7$, $C_{12}H_9$, Y is independently $CH_3$, $C_2H_5$, $C_3H_7$, $C_6H_5$, $C_{10}H_7$, $C_{12}H_9$, R is independently $CH_2$, $C_2H_4$, $C_3H_6$, $OCH_2$, $OC_2H_4$, $OC_3H_6$, $OC_2H_2$, $C_2H_2O$, $C_3H_4O$, $C_4H_6O$, and n is 1-100; and a redistribution layer disposed on the insulating encapsulant and electrically connected to the semiconductor die.

2. The semiconductor package according to claim 1, further comprising through insulator vias embedded in the insulating encapsulant and electrically connected to the redistribution layer.

3. The semiconductor package according to claim 2, further comprising a second package disposed on the first package, wherein the second package is electrically connected to the first package by electrically connecting a plurality of electrical connectors of the second package to the through insulator vias of the first package.

4. The semiconductor package according to claim 3, wherein the first package further comprises a backside redistribution layer disposed on and electrically connected to the through insulator vias, wherein the second package is electrically connected to the first package by electrically connecting a plurality of electrical connectors of the second package to the backside redistribution layer and the through insulator vias of the first package.

5. The semiconductor package according to claim 1, wherein the stress relaxation agent contained in an amount of 0.5% by weight to 5% by weight based on a total weight of the molding composition.

6. The semiconductor package according to claim 1, wherein the stress relaxation agent is a compound represent by formula (1-A):

formula (1-A)

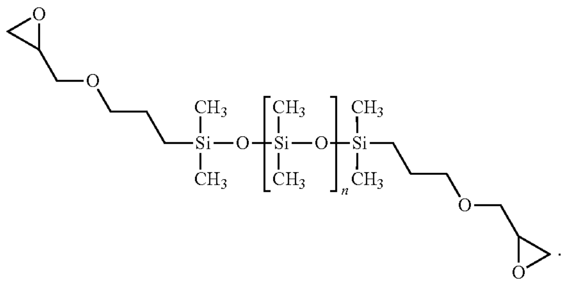

n = 10

7. The semiconductor package according to claim 1, wherein the molding composition further comprises:

fillers, contained in an amount of 80% by weight to 90% by weight based on a total weight of the molding composition;

a resin, contained in an amount of 1% by weight to 15% by weight based on the total weight of the molding composition; and a hardener, contained in an amount of 1% by weight to 15% by weight based on the total weight of the molding composition.

8. The semiconductor package according to claim 7, wherein the resin is contained in an amount of 2% to 5% and the hardener is contained in an amount of 2% to 5% based on the total weight of the molding composition.

9. A method of fabricating a semiconductor package, comprising:

forming a first package by:

placing a semiconductor die on a carrier;

forming an insulating encapsulant on the carrier and surrounding the semiconductor die, wherein the insulating encapsulant is formed from a molding composition comprising:

a stress relaxation agent composed of silicone oil; and an anhydride-based hardener, wherein the stress relaxation agent is at least one compound selected from the group of compounds represented by formula (1):

formula (1)

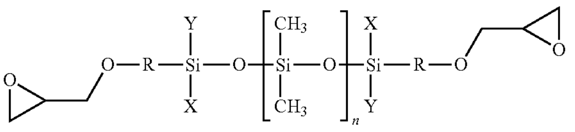

wherein, in formula (1), X is independently $CH_3$, $C_2H_5$, $C_3H_7$, $C_6H_5$, $C_{10}H_7$, $C_{12}H_9$, Y is independently $CH_3$, $C_2H_5$, $C_3H_7$, $C_6H_5$, $C_{10}H_7$, $C_{12}H_9$, R is independently $CH_2$, $C_2H_4$, $C_3H_6$, $OCH_2$, $OC_2H_4$, $OC_3H_6$, $OC_2H_2$, $C_2H_2O$, $C_3H_4O$, $C_4H_6O$, and n is 1-100, and the anhydride-based hardener is selected from the group consisting of methylhexahydrophthalic anhydride, 3-methylhexahydrophthalic anhydride, 5-methylhexahydrophthalic anhydride, and phenylmaleic anhydride;

forming a redistribution layer disposed on the insulating encapsulant and electrically connected to the semiconductor die; and debonding the carrier.

10. The method according to claim 9, further comprises:

forming a plurality of through insulator vias on the carrier and surrounding the semiconductor die; and forming the insulating encapsulant to encapsulate the semiconductor die and the plurality of through insulator vias.

11. The method according to claim 10, wherein after debonding the carrier, the method further comprises stacking a second package on the first package by electrically connecting a plurality of electrical connectors of the second package to the plurality of through insulator vias.

12. The method according to claim 9, further comprises:

forming a backside redistribution layer on the carrier prior to placing the semiconductor die;

placing the semiconductor over the backside redistribution layer and on the carrier; and forming a plurality of through insulator vias disposed on and electrically connected to the backside redistribution layer.

13. The method according to claim 9, wherein the molding composition is prepared by adding 0.5% by weight to 5% by weight of the stress relaxation agent based on a total weight of the molding composition.

14. The method according to claim 13, wherein the molding composition is prepared by further adding 80% by weight to 90% by weight of fillers, 1% by weight to 15% by weight of a resin and 1% by weight to 15% of a hardener based on the total weight of the molding composition.

15. A semiconductor package, comprising:

an insulating encapsulant for encapsulating semiconductor components, wherein the insulating encapsulant is formed by curing a molding composition which consists of:

a resin, contained in an amount of 1% by weight to 15% by weight based on a total weight of the molding composition, wherein the resin is a diepoxy resin or a multifunctional epoxy resin;

inorganic fillers contained in an amount of 80% by weight to 90% by weight based on the total weight of the molding composition;

a hardener, contained in an amount of 1% by weight to 15% by weight based on the total weight of the molding composition; and a stress relaxation agent composed of silicone oil, contained in an amount of 0.5% by weight to 5% by weight based on the total weight of the molding composition; and a redistribution layer disposed on the insulating encapsulant and electrically connected to the semiconductor components.

16. The semiconductor package according to claim 15, wherein the stress relaxation agent is at least one compound selected from the group of compounds represented by formula (1):

formula (1)

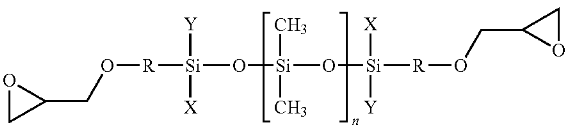

wherein, in formula (1), X is independently $CH_3$, $C_2H_5$, $C_3H_7$, $C_6H_5$, $C_{10}H_7$, $C_{12}H_9$, Y is independently $CH_3$, $C_2H_5$, $C_3H_7$, $C_6H_5$, $C_{10}H_7$, $C_{12}H_9$, R is independently $CH_2$, $C_2H_4$, $C_3H_6$, $OCH_2$, $OC_2H_4$, $OC_3H_6$, $OC_2H_2$, $C_2H_2O$, $C_3H_4O$, $C_4H_6O$, and n is 1-100.

17. The semiconductor package according to claim 16, wherein the stress relaxation agent is a compound represent by formula (1-A):

formula (1-A)

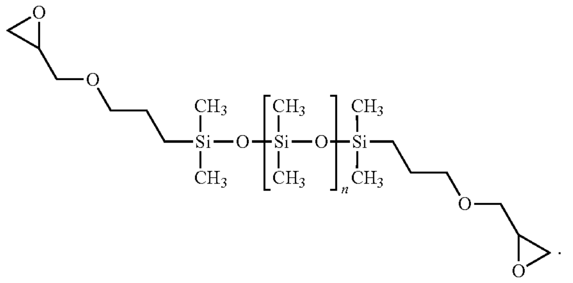

n = 10

18. The semiconductor package according to claim 15, wherein the hardener is an anhydride-based hardener or an amine-based hardener.

19. The semiconductor package according to claim 15, wherein the the inorganic filler is a silicon oxide filler.

20. The semiconductor package according to claim 15, wherein the diepoxy resin is selected from the group consisting of 1,6-bis(2,3-epoxypropoxy) naphthalene, 2,6-bis(2,3-epoxypropoxy) acetophenone, 2,2-Bis(4-glycidyloxyphenyl) propane, and 3,4-epoxycyclohexylmethyl 3,4-epoxycyclohexanecarboxylate, and the multifunctional epoxy resin is selected from the group consisting of 1-(2,3-epoxypropoxy)-2,2-bis[(2,3-epoxypropoxy)methyl]butane, triphenylolmethane triglycidyl ether, 1,1,1-tris(4-hydroxyphenyl) ethane triglycidyl ether, and tris(oxiranylmethyl) benzene-1,3,5-tricarboxylate.

* * * * *